United States Patent
Wierach

(10) Patent No.: US 6,930,439 B2
(45) Date of Patent: Aug. 16, 2005

(54) ELECTROMECHANICAL FUNCTIONAL MODULE AND ASSOCIATED PROCESS

(75) Inventor: Peter Wierach, Bad Harzburg (DE)

(73) Assignee: DLR Deutsches Zentrum fuer Luft- und Raumfahrt e.V., Cologne (DE)

( * ) Notice: Subject to any disclaimer, the term of this patent is extended or adjusted under 35 U.S.C. 154(b) by 0 days.

(21) Appl. No.: 09/982,426

(22) Filed: Oct. 18, 2001

(65) Prior Publication Data

US 2002/0047496 A1 Apr. 25, 2002

(30) Foreign Application Priority Data

Oct. 19, 2000 (DE) .......................................... 100 51 784

(51) Int. Cl.$^7$ .............................................. H01L 41/08
(52) U.S. Cl. ....................... 310/340; 310/328; 310/330; 310/366
(58) Field of Search ................................ 310/328, 340, 310/363, 365, 348

(56) References Cited

U.S. PATENT DOCUMENTS

| | | | | |
|---|---|---|---|---|
| 4,849,668 A | * | 7/1989 | Crawley et al. ............ | 310/328 |
| 4,857,887 A | * | 8/1989 | Iten .............................. | 341/34 |
| 4,876,776 A | | 10/1989 | Whatmore et al. | |
| 5,305,507 A | | 4/1994 | Dvorsky et al. | |
| 5,315,203 A | | 5/1994 | Bicos | |
| 5,347,870 A | | 9/1994 | Dosch et al. | |
| 5,378,974 A | | 1/1995 | Griffin | |
| 5,404,067 A | * | 4/1995 | Stein et al. ................ | 310/330 |
| 5,485,053 A | | 1/1996 | Baz | |
| 5,519,279 A | * | 5/1996 | Zimnicki .................... | 310/363 |
| 5,656,882 A | | 8/1997 | Lazarus et al. | |
| 5,687,462 A | | 11/1997 | Lazarus et al. | |
| 5,894,651 A | * | 4/1999 | Dvorsky et al. ............ | 310/344 |
| 6,208,026 B1 | * | 3/2001 | Bindig et al. ............... | 257/718 |
| 6,307,306 B1 | * | 10/2001 | Bast et al. ................... | 310/366 |
| 6,376,971 B1 | * | 4/2002 | Pelrine et al. .............. | 310/363 |
| 6,420,819 B1 | * | 7/2002 | Lazarus et al. ............. | 310/330 |
| 6,570,300 B1 | * | 5/2003 | Riedel et al. ............... | 310/363 |

FOREIGN PATENT DOCUMENTS

WO     WO 95/20827     8/1995

\* cited by examiner

Primary Examiner—Mark Budd
(74) Attorney, Agent, or Firm—Husch & Eppengerger, LLC; Robert C. Haldiman

(57) ABSTRACT

An electromechanical functional module and associated process for production thereof, which includes at least one transducer, at least one upper fiber cover layer, which is nonconducting and is positioned over the at least one transducer having a first electrode and a second electrode, at least one lower fiber cover layer, which is nonconducting and is positioned below the at least one transducer, at least one fiber interlayer, which is nonconducting with at least one cut-out for accommodating the at least one transducer, at least one upper electric contact strip that is integrally connected to the at least one upper fiber cover layer and in contact with the first electrode of the at least one transducer, and at least one lower electric contact strip that is integrally connected to the at least one lower fiber cover layer and in contact with the second electrode of the at least one transducer, wherein the at least one upper fiber cover layer, the at least one lower fiber cover layer and the at least one transducer are laminated together. Lamination can include, but is not limited to, a resin matrix that is injected into the electromechanical functional module under a vacuum.

22 Claims, 3 Drawing Sheets

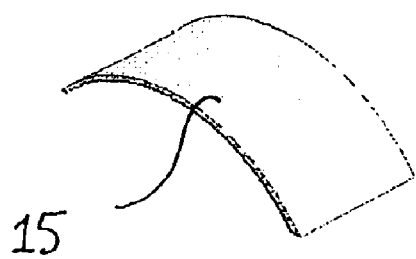
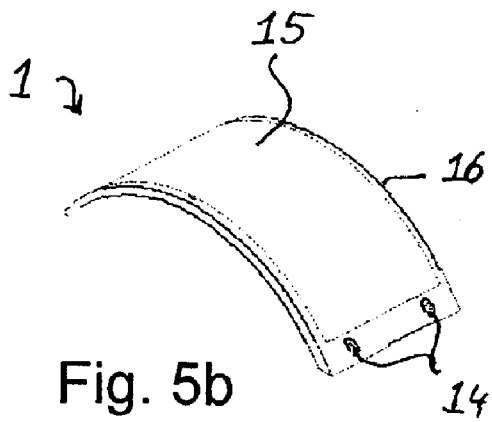
Fig. 5a
Fig. 5b
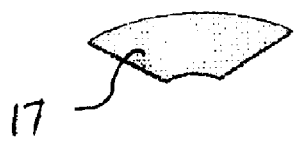
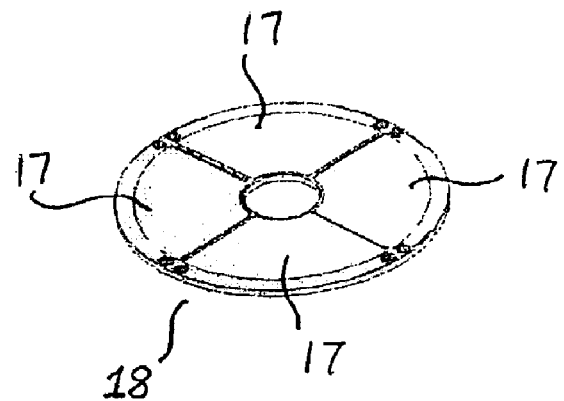
Fig. 5c
Fig. 5d

ELECTROMECHANICAL FUNCTIONAL MODULE AND ASSOCIATED PROCESS

BACKGROUND OF THE INVENTION

The invention relates to an electromechanical functional module. Such functional modules, e.g. in the form of piezoelectric transducer elements, are used primarily for structure systems, which with self-regulating mechanisms can adapt to changing environmental conditions and are referred to as adaptive structures or smart structures. In such adaptive structures, sensors and actuators in combination with suitable controllers are integrated into the structure. Thus, such a structure is able to detect external changes and to respond appropriately to them. In contrast with conventional structures having passive spring or damping elements, the adaptive components form an integral part of the structure. Disturbances, such as unwanted deformations or vibrations for example, can be counteracted directly at the point of origin.

Since the structures combine both support functions and actuatory or sensory functions, these structures can provide a greater potential for lightweight construction and applications associated with the aerospace technology. In addition, however, there are also diverse possibilities for applications in other industries, e.g. for the reduction of noise and vibrations, for contour deformation and stabilization (shape control) and for high-precision positioning.

Piezoceramic materials exploiting the piezoelectric effect or the inverse piezoelectric effect may advantageously be used as actuators and sensors, which are integrated into the structure. Due to their constitution, however, these piezoceramic materials are extremely fragile and, accordingly, break very easily. In particular, this disadvantage becomes clearly apparent in the use of thin, discoid piezoceramics or piezofilms having a thickness of approximately 0.2 millimeters (0.0078 inches). Accordingly, due to the fragility of the piezofilm, the piezofilm was conventionally enveloped for protection prior to the installation of a piezofilm into a functional module. This provides defined mechanical and electrical boundary conditions for the piezofilm. By this means, the handling of the piezofilm is considerably simplified. In these electromechanical functional modules, an electrical contact for the electrodes of the piezoceramic transducer and electrical connectors for the transducer are embedded in the functional module.

Such electronic functional modules can be integrated as expansion and flexure actuators or sensors into any structures or applied onto the latter. In addition, they can be produced in the form of complex geometries. The use of piezoelectric transducers as both actuators and sensors is disclosed, for example, by U.S. Pat. No. 5,347,870, which issued to Dosch, et al. on Sep. 20, 1994.

U.S. Pat. No. 4,849,668, which issued to Crawley, et al. on Jul. 18, 1989, discloses the direct integration of piezoceramics in multilayered structures such as a carbon fiber laminate. Inner layers of the structures have cutouts for accommodating piezoceramics. Insulating layers are provided between the piezoceramics. A disadvantage is that the piezoelectric actuators and/or sensors must have their contacts made and fabricated during the production of the structure. In addition, mechanical problems arise such as the fatigue resistance of the electric contacts, the electrical insulation of the current-carrying components and the risk of breakage of the fragile piezoceramic during production.

U.S. Pat. No. 5,485,053, which issued to Baz on Jan. 16, 1996, discloses a three-layered vibration and sound-damping structure in which a viscoelastic damping layer is arranged between two piezoelectric layers. One piezoelectric layer serves as vibration sensor while the other piezoelectric layer is used as an actuator for the compensation of the vibrations.

U.S. Pat. No. 5,378,974, which issued to Griffin on Jan. 3, 1995, discloses the use of piezoceramic actuators driven in opposite directions for a vibration-damping system. A corresponding system is also described in U.S. Pat. No. 5,315,203, which issued to Bicos on May 24, 1994 and discloses the electric field of one piezoelectric element being applied in the opposite direction to a second piezoelectric element. In this manner, an oppositely directed deformation is brought about without the need for other control mechanisms.

Furthermore, piezoelectric functional modules are known that can be built into composite structures as prefabricated compact elements. Thus, U.S. Pat. No. 4,876,776, which issued to Whatmore, et al. on Oct. 31, 1989, discloses the fitting of piezoelectric elements into a composite structure, the composite structure having recesses for accommodating the piezoelectric elements and being prefabricated before the installation of the piezoelectric elements.

U.S. Pat. No. 5,305,507, which issued to Dvorsky, et al. on Apr. 26, 1994, discloses the installation of a piezoelectric actuator or sensor in a nonconducting fiber composite material, such as a glass fiber or epoxide as examples. In this case, the piezoceramic elements are first completely wired and only then laminated into place.

U.S. Pat. No. 5,687,462, which issued to Lazarus et al. on Nov. 18, 1997, and U.S. Pat. No. 5,656,882, which issued to Johnson on Aug. 19, 1997 as well as PCT Application Ser. No. PCT/US95/01111 having an International Publication No. WO 95/20827, which was published on Aug. 3, 1995, discloses a piezoelectric functional module in which a piezoceramic is bonded into a polyimide film. Contact is made to the electrodes via thin applied strip conductors made from copper foil, which are likewise bonded between the polyimide films. Electric contact is made to the piezoelectric transducers via plugs, which are clipped onto the polyimide films.

PCT Application Ser. No. PCT/US95/01111, International Publication No. WO 95/20827, page 9, lines 26 et seq., further discloses the use of frame elements between the polyimide films for accommodating the piezoceramics, which also serve as spacers during fabrication. The frame elements are made from a relatively highly compressible material, such as a non-cross-linked polymer, having a low modulus of elasticity.

In the known piezoelectric functional modules, making electric contact is particularly problematic. In cases of long operating periods, cracking may be observed in the strip conductors formed of thin copper foil at the junction between the piezoelectric transducer and the surrounding sheath. Due to the contact being made by a copper foil, the electrode of the piezoceramic is also only incompletely covered so that in the event of a breakage in the piezoceramic, the loss of active performance of the piezoceramic does occur.

In the integration of the conventional piezoelectric functional modules in fiber composite structures it is also disadvantageous that relatively many fibers have to be cut to make the electrical connections to the outside. This directly impairs the strength of the fiber composite structure.

In addition, the adhesion of the polyimide film in fiber composite structures is relatively poor so that the surfaces require expensive treatment. Polyimide films also absorb relatively high amounts of moisture so that there is the risk of electrical short-circuiting when piezoelectric functional modules are operating in a moist environment.

The present invention is directed to overcoming one or more of the problems set forth above.

SUMMARY OF THE INVENTION

An aspect of the present invention is an electromechanical functional module, which includes at least one transducer, at least one upper fiber cover layer, which is nonconducting and is positioned over the at least one transducer, at least one lower fiber cover layer, which is nonconducting and is positioned below the at least one transducer, at least one fiber interlayer, which is nonconducting with at least one cut-out for accommodating the at least one transducer having a first electrode and a second electrode, at least one upper electric contact strip that is integrally connected to the at least one upper fiber cover layer and in contact with the first electrode of the at least one transducer, and at least one lower electric contact strip that is integrally connected to the at least one lower fiber cover layer and in contact with the second electrode of the at least one transducer, wherein the at least one upper fiber cover layer, the at least one lower fiber cover layer and the at least one transducer are laminated together.

By using fiber covering material a good connection is obtained between the functional module and the composite structure into which the functional module is built. The electric contact strips, which are integrally connected to the fiber covering layer, ensure a durable, reliable contact with the transducer, e.g. a piezoceramic. The electric contact strips are led through are led through the fiber covering layer to the outside. As a result of this process, the cutting of the fibers and disturbance of the fiber composite structure with resultant loss of strength does not occur. Lamination can include, but is not limited to, a resin matrix that is injected into the electromechanical functional module under a vacuum.

By using several fiber interlayers, which are laminated together with the fiber covering layers, an integral structure is formed in which the transducer is completely encapsulated. Through the choice of the fibrous material, the resin system and the orientation of the fibers, it is possible to influence the rigidity of the functional module with regard to the transmission of expansion between the electromechanical functional module and the composite structure surrounding the latter.

The contact strips are preferably woven carbon fibers or metal wires embedded in the fiber covering layers. Through this elastic contact with the electrodes of the transducers, the fatigue resistance properties are improved. The transducers can, for example, operate in piezoceramic or electrostrictive manner.

The fiber covering layers and fiber interlayers are preferably formed of polyester felt.

The following steps are proposed for the efficient and trouble-free production of the electromechanical functional modules described above:

laminating at least one upper electric contract strip to at least one upper fiber cover layer;

laminating at least one lower electric contact strip to at least one lower fiber cover layer;

positioning at least one transducer in a cut-out for at least one nonconducting fiber interlayer;

positioning the at least one upper fiber cover layer, which is nonconducting, over the at least one transducer; positioning the at least one lower fiber cover layer, which is nonconducting below the at least one transducer; and injecting resin into the combination of the at least one transducer, the at least one upper fiber cover layer, the at least one lower fiber cover layer, and the least one fiber interlayer.

Injection is preferably done under vacuum, e.g. by the differential-pressure resin-transfer molding process. This has the advantage that a high fiber volume content without air pockets can be achieved.

The above aspects are merely illustrative examples of a few of the innumerable aspects associated with the present invention and should not be deemed an all-inclusive listing in any manner whatsoever.

BRIEF DESCRIPTION OF THE DRAWINGS

Reference is now made more particularly to the drawings which illustrate the best presently known mode of carrying out the invention and wherein similar reference characters indicate the same parts throughout the drawing figures.

The invention is explained in more detail below with reference to the attached drawings. These show:

FIG. 5a is a view in perspective of curved piezofilm;

FIG. 5b is a view in perspective of curved piezofilm from FIG. 5a that is incorporated into an electromechanical functional module;

FIG. 5c is a view in perspective of plate-shaped piezofilm; and

FIG. 5d is a view in perspective of plate-shaped piezofilm from FIG. 5c that is incorporated into an electromechanical functional module;

DETAILED DESCRIPTION OF THE INVENTION

Figure 1:
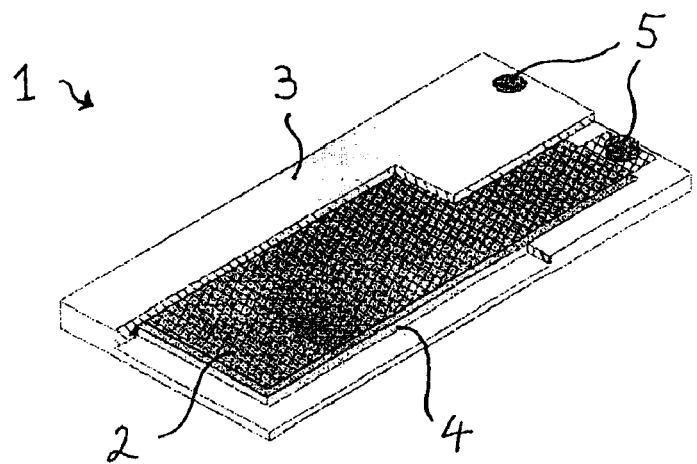
FIG. 1 is a perspective view of an electromechanical functional module according to the present invention.

Referring now to FIG. 1, which shows a perspective view of a piezoelectric electromechanical functional module 1. The piezoelectric functional module 1 is a transducer, which can utilize a piezoceramic 2 or piezofilm that is surrounded by an electrically insulating envelope. This envelope is formed from at least one upper nonconducting fiber covering layer 3 on the upper side of the piezoceramic 2 and at least one lower nonconducting fiber covering layer 3 on the bottom side of the piezoceramic 2 together with at least one and preferably several nonconducting fiber interlayers 4.

The electrical connections for the electrodes of the piezoceramic 2 are led out of the fiber covering layers 3 in the form of contact spots 5.

Figure 2:
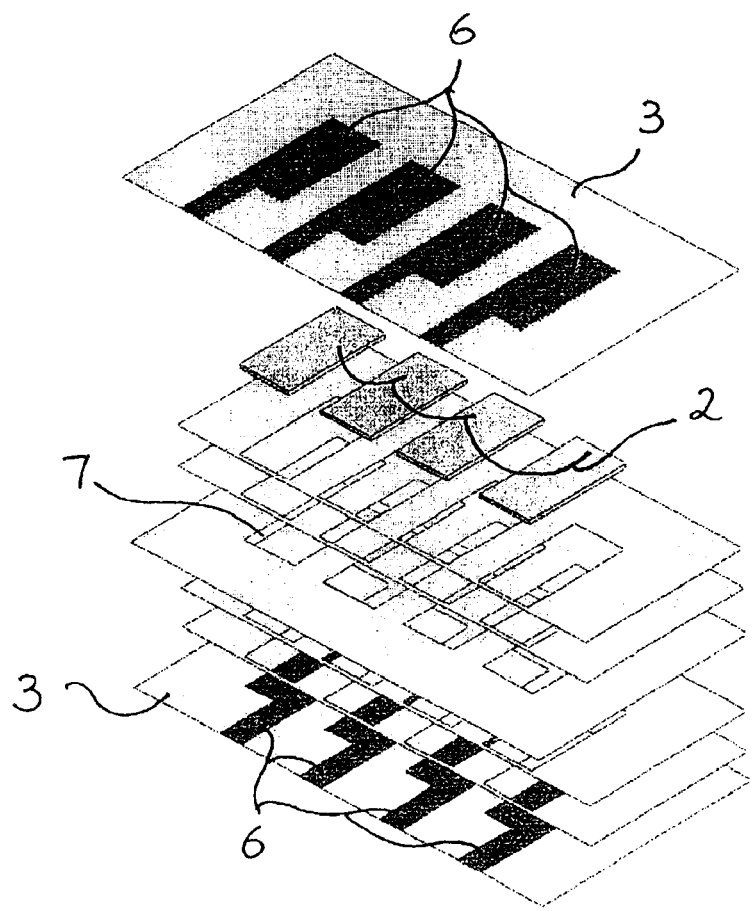
FIG. 2 is an exploded perspective view of a group of electromechanical functional modules according to the present invention.

FIG. 2 shows a detailed, exploded view the structure of a group of piezoelectric functional modules 1. Located in the upper and lower fiber covering layers 3, there are electric contact strips 6, e.g., in the form of woven elastic which could include carbon fiber fabric, thin metal wire fabric, or other types of conductive fibers or fabric. The electric contact strips 6 are integrally connected as fabric with the fiber covering layers 3 and almost completely covering the surface of the piezoceramic 2. The electric contact strips 6 are laminated onto the fiber covering layers 3, e.g., preferably using an epoxide resin having thermoplastic properties.

Due to the relatively large area of contact on both sides of the electrodes of the piezoceramic 2, the problems created due to breaks in the piezoceramic 2 are reduced providing a greater tolerance for damage of the piezoceramic 2. Also, it is then ensured that the electrode surface remains almost completely in electrical contact. Due to the use of fabric for the contact strips 6, the functional module remains elastic and has a higher service life.

Between the upper and lower fiber covering layers 3 is at least one and preferably a plurality of fiber interlayers 4, which includes cut-outs 7 for accommodating the piezoceramics 2, i.e., the piezoelectric or electrostrictive transducers. By selectively adapting a number of fiber interlayers 4, functional modules 1 having different thicknesses can be produced and the pressure on the fragile piezoceramic 2 can be adjusted. The piezoceramic 2 is at risk of breaking during the compression process during production. The fiber interlayers 4 thus serve as spacers for the piezoceramic 2. With the aid of the cut-outs 7 in the fiber interlayers 4, the piezoceramics 2 are held in position during production so that the piezoceramics 2 can no longer be displaced.

The upper and lower fiber covering layers 3 and the at least one fiber interlayer 4 are laminated together under vacuum by suitable methods, such as the differential-pressure resin-transfer molding (DP-RTM) injection process. The mechanical pre-compression of the piezoelectric functional modules 1 can be adjusted by a suitable choice of resin systems and curing cycles for the laminate. In doing so, the different thermal coefficients of expansion of the at least one fiber interlayer 4 and the upper and lower fiber covering layers 3 and of the piezoceramics 2 have to be taken into account. Through the choice of a resin system, however, it is also possible to influence the elastic properties of the envelope of the functional module 1 and hence the transmission of expansion between the functional module 1 and an outer composite structure.

FIG. 2 shows a layout having four functional modules 1. From the fiber composite panel illustrated the desired units having one or more functional modules 1 can be cut out. The production of the functional modules in groups is highly efficient and advantageous in production technology terms.

Figure 3:
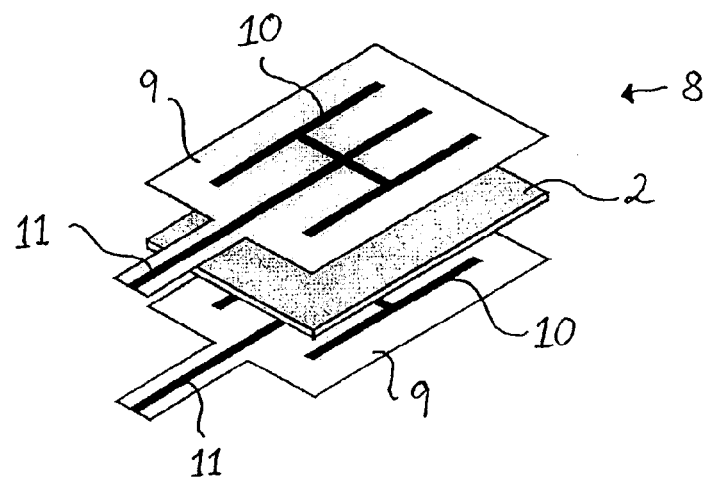
FIG. 3 is an exploded perspective view of a conventional piezoelectric functional module according to the present invention.

In contrast, FIG. 3 shows an exploded view of a conventional piezoelectric functional module 8. In this case, the piezoceramic 2 is bonded into a sheath composed of an upper and a lower support film 9. On the inside of the support film 9, there are conductor strips 10 for making electrical contact with the piezoceramic 2. These conductor strips 10 are glued in position. Each of the support films 9 have a connection lug 11 for connecting to external electric circuits, which is led out of the fiber composite structure and fitted into the piezoelectric functional module 8. The electrical connection of the conductor strips 10 preferably takes place by means of plugs. For the support film 9, polyimide films can be utilized that have a relatively high moisture absorption capacity. This gives rise to the risk of electric short-circuits when the functional module 8 operates in a moist environment. In addition, inadequate adhesion of the polyimide film is observed in fiber composite structures so that the surfaces of the fiber composite structures require expensive treatment. Due to the relatively wide area of electrical connection for the functional module 8, relatively many fibers must be cut through in the integration of the functional module 8 in fiber composite structures in order to take the electrical connection to the outside. This results in a loss of strength. Furthermore, when operating times are long, crack formation in the conductors strips 10 may be observed on the relatively thin copper foil at the junction between the piezoceramic 2 and the support film 9.

In contrast with this conventional functional module 8 shown in FIG. 3, the present invention, as shown in FIGS. 1 and 2, includes at least one and preferably several fiber interlayers 4 that are provided to which electric contact strips 6, e.g., woven elastic, are integrally connected. The fiber interlayers 4 serve, in this case, as spacers for the optimum encapsulation of the piezoceramics 2. Due to the fact that fiber material is used throughout, the fiber covering layers 3 and the fiber interlayers 4 can be laminated together. This makes it possible to adjust the mechanical parameters of the envelope thus produced.

Figures 4A, 4B, 4C:
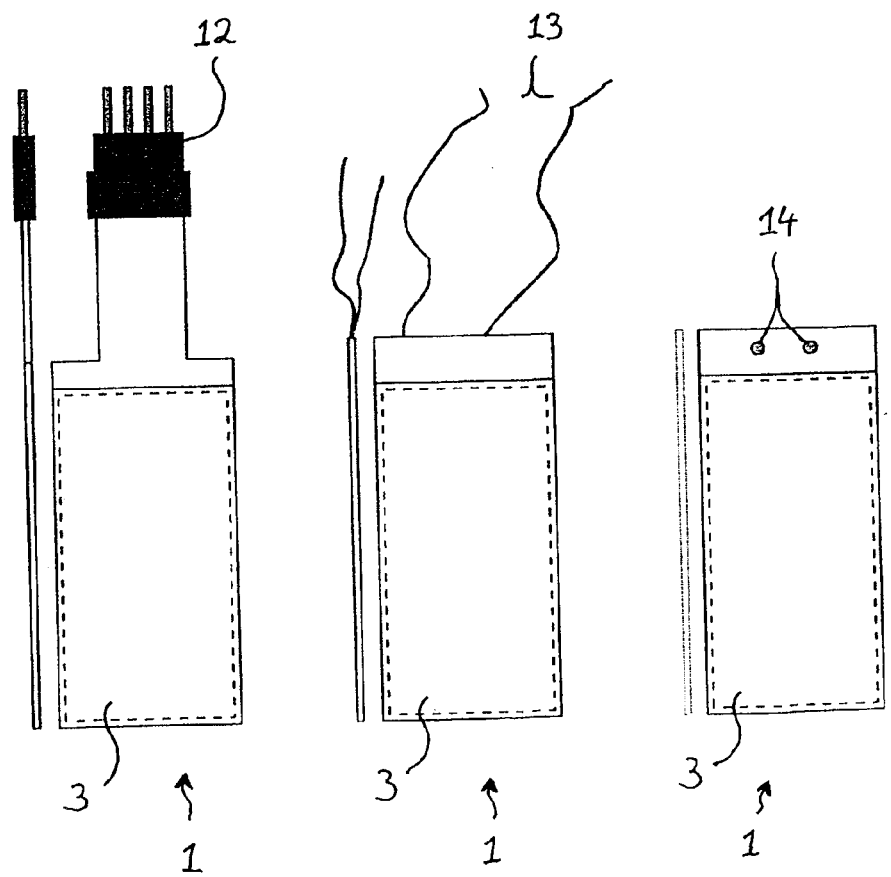
FIG. 4a is a plan view of an electromechanical functional module illustrating electrical contact strips led out of the fiber composite system of the present invention by way of a connecting lug having a plug.
FIG. 4b is a plan view of an electromechanical functional module illustrating a single lead out of the fiber composite system of the present invention.
FIG. 4c is a plan view of an electromechanical functional module illustrating use of soldering points out of the fiber composite system of the present invention.

The functional modules 1 are connected to external circuits by electrical connections illustrated by way of example in FIGS. 4a, 4b and 4c. In this case, the electrical contact strips 6, shown in FIG. 2, can be led out of the fiber composite system by way of a connecting lug having a plug 12, as shown in FIG. 4a. However, it is also possible to lead out single leads 13 from the functional module 1, as shown in FIG. 4b. It is particularly advantageous to use soldering points 14 in the fiber covering layers 3, as shown in FIG. 4c. This alternative form of connection allows subsequent stacking and arrangement of several functional modules 1 to form packs of modules. In doing so the functional modules 1 are arranged in such a way that the soldering points 14 lie on top of one another with contact to one another. Bending transducers can be implemented by lying the functional modules on top of one another in such a way that their soldering points 14 are each connected with reverse polarity.

FIGS. 5a, 5b, 5c and 5d shows functional modules 1 in the form of complex structures. It is possible, for example, to build a curved piezofilm 15, shown in FIG. 5a, into a correspondingly curved envelope of an electromechanical functional module 16 with soldering points 14 as shown in FIG. 5b.

Furthermore, the piezofilms can also be built in the form of segments 17, as shown in FIG. 5c, of a plate-shaped structure 18 that is formed into a circle 18, as shown in FIG. 5d, where it is possible, for example, for each fourth segment to separately addressable. Further complex shapes of any kind are correspondingly conceivable.

What is claimed is:

1. An electromechanical functional module comprising:
at least one transducer having a first electrode and a second electrode and having a top and a bottom;
at least one upper fiber cover layer, which is nonconducting and is positioned over the at least one transducer;
at least one lower fiber cover layer, which is nonconducting and is positioned below the at least one transducer;
at least one fiber interlayer, which is nonconducting with at least one cut-out for accommodating the at least one transducer;

at least one upper electric contact strip that is integrally laminated onto the at least one upper fiber cover layer by use of an epoxy resin having thermoplastic properties and in contact with the first electrode of the at least one transducer, the upper electric contact strip substantially covering said top of said at least one transducer; and at least one lower electric contact strip that is integrally laminated onto the at least one lower fiber cover layer by use of an epoxy resin having thermoplastic properties and in contact with the second electrode of the at least one transducer, the lower electric contact strip substantially covering said bottom of said at least one transducer;

wherein the at least one upper fiber cover layer, the at least one lower fiber cover layer, the at least one transducer and the at least one fiber interlayer are in a unitary resin body;

wherein the at least one upper electric contact strip includes woven elastic and the at least one lower electric contact strip includes woven elastic.

2. The electromechanical functional module according to claim 1, wherein the at least one upper electric contact strip and the at least one lower electric contact strip includes carbon fibers.

3. The electromechanical functional module according to claim 1, wherein the at least one upper electric contact strip and the at least one lower electric contact strip includes metal wires.

4. The electromechanical functional module according to claim 1, wherein the at least one upper fiber cover layer, the at least one lower fiber cover layer and the at least one fiber interlayer are laminated together to form a fiber composite.

5. The electromechanical functional module according to claim 4, wherein the laminated fiber composite includes a resin.

6. The electromechanical functional module according to claim 1, wherein the at least one transducer includes a piezoceramic.

7. The electromechanical functional module according to claim 1, wherein the at least one transducer includes an electrostrictive.

8. The electromechanical functional module according to claim 1, wherein the at least one upper fiber cover layer, the at least one lower fiber cover layer and the at least one fiber interlayer includes polyester felt.

9. An electromechanical functional module comprising:
an nonconductive fiber interlayer having a cut-out therethrough;
a transducer located within the cut-out and positioned thereby;
upper and lower fiber cover layers respectively lying over and below the transducer and interlayer;
an upper electric contact strip of woven elastic laminated to the upper fiber cover layer, the upper electric contact strip in contact with and substantially overlying the transducer;
a lower electric contact strip of woven elastic laminated to the lower fiber cover layer, the lower electric contact strip in contact with and substantially underlying the transducer; and
a resin injected into the combination of the transducer, the upper and lower fiber cover layers, and the fiber interlayer;
thereby forming the electromechanical functional module.

10. An electromechanical functional module as set forth in claim 9 including a resin for laminating the upper and lower electric contact strips to their respective upper and lower fiber cover layers.

11. An electromechanical functional module as set forth in claim 9, wherein the upper and lower electric contact strips include carbon fibers.

12. An electromechanical functional module as set forth in claim 9, wherein the upper and lower electric contact strips include metal wires.

13. An electromechanical functional module as set forth in claim 9, wherein the resin includes an epoxide resin with thermoplastic qualities.

14. An electromechanical functional module as set forth in claim 9, wherein the resin is a resin matrix.

15. An electromechanical functional module as set forth in claim 9, wherein the resin injected into the combination of the transducer, the upper and lower fiber cover layers, and the fiber interlayer is injected by applying a vacuum.

16. An electromechanical functional module as set forth in claim 9, wherein the transducer is a piezoelectric element.

17. An electromechanical functional module as set forth in claim 15, wherein the upper and lower fiber cover layers, and the fiber interlayer serve to encapsulate the piezoelectric element.

18. An electromechanical functional module as set forth in claim 17, wherein the piezoelectric element is shaped to form a curved piezofilm.

19. An electromechanical functional module of claim 9 wherein said upper electric contact strip completely covers the transducer.

20. The electromechanical functional module of claim 9 wherein said lower electric contact strip completely underlies the transducer.

21. The electromechanical functional module of claim 9 wherein said upper electric contact strip overlies said transducer and extends to three out of four edges of said transducer.

22. The electromechanical functional module of claim 9 wherein said lower electric contact strip underlies said transducer and extends to three of four sides of said transducer.

* * * * *